United States Patent
Kumar et al.

(10) Patent No.: US 6,370,006 B1
(45) Date of Patent: Apr. 9, 2002

(54) ELECTROSTATIC CHUCK HAVING A PLURALITY OF GAS INLET CHANNELS

(75) Inventors: Ananda H. Kumar, Milpitas; Kadthala Narendrnath; Shamouil Shamouilian, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/506,423

(22) Filed: Feb. 17, 2000

(51) Int. Cl.[7] ............................................... H02N 13/00
(52) U.S. Cl. ..................................................... 361/234
(58) Field of Search ......................................... 361/234

(56) References Cited

U.S. PATENT DOCUMENTS

| | | | |
|---|---|---|---|
| 5,856,906 A | 1/1999 | Kholodenko et al. | ........ 361/234 |
| 5,885,469 A | 3/1999 | Kholodenko et al. | .......... 216/11 |
| 6,243,251 B1 * | 8/1999 | Kanno et al. | ................ 361/234 |
| 6,104,596 A * | 8/2000 | Hausmann | ................... 361/234 |

* cited by examiner

*Primary Examiner*—Peter S. Wong
*Assistant Examiner*—Pia Tibbits
(74) *Attorney, Agent, or Firm*—Moser, Patterson, and Sheridan L.L.P.

(57) ABSTRACT

An electrostatic chuck and a process of manufacturing an electrostatic chuck for supporting a semiconductor wafer during wafer processing and for providing a plurality of gas inlet channels extending through the chuck and through which thermal transfer gas can be supplied to the back side of the wafer to enhance the thermal transfer between the wafer and the chuck, embedding a plurality of inserts in a ceramic electrostatic chuck, each insert comprising a matrix of the ceramic of which the electrostatic chuck is made and a plurality of removable elongate members, and removing the elongate members to form a plurality of elongate holes providing the plurality of gas inlet channels.

32 Claims, 4 Drawing Sheets

ELECTROSTATIC CHUCK HAVING A PLURALITY OF GAS INLET CHANNELS

BACKGROUND OF THE DISCLOSURE

1. Field of the Invention

The invention generally relates to electrostatic chucks for supporting a semiconductor wafer in a semiconductor wafer processing system. More particularly, the present invention relates to a process of manufacturing such an electrostatic chuck having relatively small diameter gas inlet channels that supply a heat transfer medium to the surface of the chuck.

2. Description of the Background Art

Typical semiconductor wafer processing apparatus 10 is illustrated in FIG. 1. The apparatus 10 includes an electrostatic chuck 12 having a top wafer support surface 14 in which is embedded an electrode 16 connected to a DC/RF supply 18. The supply 18 supplies DC voltage to the electrode 16 to provide a DC bias voltage to electrostatically retain the semiconductor wafer 20 on the top surface 14 of the electrostatic chuck 12. The supply 18 may also provide RF current or energy to the apparatus 10 to ignite a plasma above the wafer 20. As is known to those skilled in the semiconductor wafer processing art, the use of high plasma power improves etch rates, facilitates increased aspect ratios, and provides various other process improvements. The use of high plasma power imparts additional heat to the semiconductor wafer 20 during processing, and unless heating of the semiconductor wafer 20 is controlled, the semiconductor wafer can be so heated that the partially processed semiconductor wafer becomes damaged. To permit the use of high plasma power, it is known, as illustrated in FIG. 1, to mount the electrostatic chuck on a base 24 which is provided with a plurality of coolant receiving channels 25. The receiving channels 25 carry suitable coolant flows for cooling the electrostatic chuck 12 which in turn cools the semiconductor wafer 20.

In spite of reasonable efforts to make the bottom surface of the wafer 20, referred to in the art as the backside of the wafer, smooth, and to make the top or support surface 14 of the electrostatic chuck 12 smooth, surface irregularities are present that result in interstitial spaces, or spacing, between the backside of the semiconductor wafer 20 and the support surface 14 of the electrostatic chuck 12. This interstitial spacing 26 is indicated diagrammatically in FIG. 2. Vacuum will occupy such interstitial spacing, and a vacuum, as is known, is not a good heat transfer medium for transferring heat from the wafer 20 to the electrostatic chuck 12. It is further known in the semiconductor wafer processing art to enhance the thermal transfer between the semiconductor wafer 20 and the electrostatic chuck 12 by supplying thermal transfer gas, such as helium or argon, to the interstitial spaces 26. The thermal transfer gas enhances the thermal transfer between the semiconductor wafer 20 and the electrostatic chuck 12.

Typically, the thermal transfer gas is supplied, for example, from the helium supply 30 shown in FIG. 1 through a conduit 32 to the interstitial spaces 26 in FIG. 2. Typically, the diameter of the thermal transfer gas conduit 32 is about 0.5–3 mm. It has been found that the diameter of the typical thermal transfer gas conduit, such as conduit 32, is so large that the volume of the thermal transfer gas in the conduit, can become ionized upon the RF energy being applied to the apparatus 10 to ionize the etch plasma 22 (FIG. 1) and such ionization of the thermal transfer gas invites arcing. Such arcing can pit, or otherwise damage, the backside of the wafer 20 to an extent that causes wafer damage. Such arcing can also pit, and otherwise damage, the support surface 14 of the electrostatic chuck 12 to the point where the electrostatic chuck is ruined. As is also known, the ionization of a gas is a function, at least in part, of the volume of the gas, and the larger the volume of the gas, the more likely the gas is to ionize and the smaller the volume of the gas, the less likely it is to ionize. It has been found that the volume of the thermal transfer gas, such as helium contained in the typical prior art conduit, such as conduit 32 shown in FIG. 2, invites or promotes ionization of the thermal transfer gas particularly as higher plasma powers are utilized.

Accordingly, there exists a need in the art for thermal transfer gas inlet channels in an electrostatic chuck that are so small that the volume of thermal transfer gas in such gas inlet channels has a very low tendency to ionize when higher plasma powers are utilized.

SUMMARY OF THE INVENTION

The disadvantages associated with the prior art are overcome by an electrostatic chuck and a process of fabricating the electrostatic chuck comprising the step of embedding a plurality of inserts in a ceramic electrostatic chuck, each insert comprising a matrix of the ceramic of which the electrostatic chuck is made and a plurality of removable elongate members, and removing the elongate members to form a plurality of elongate holes that define the plurality of gas inlet channels. The removable elongate members may be etchable wires, a bundle of loosely rolled etchable metal wire mesh or a plurality of etchable lines printed on ceramic and which may be removed by chemical or thermal etching. The result is an electrostatic chuck comprising at least one insert having channels of a diameter that precludes thermal transfer gas ignition.

BRIEF DESCRIPTION OF THE DRAWINGS

The teachings of the present invention can be readily understood by considering the following detailed description in conjunction with the accompanying drawings in which.

To facilitate understanding, identical reference numerals have been used, where possible, to designate identical elements that are common to the figures.

DETAILED DESCRIPTION OF THE INVENTION

A first embodiment of the process of the present invention is illustrated in FIGS. 3–13. A body 35 of ceramic material in a green state (i.e., uncured) is prepared. The green ceramic body 35 is prepared in a manner known to the art, typically, by loosely compacting ceramic material in a mold to provide a cylinder or disk of relatively pliable ceramic material having somewhat the consistency of putty. An electrode 36 is suitably embedded in the green ceramic body 35.

Figure 3:
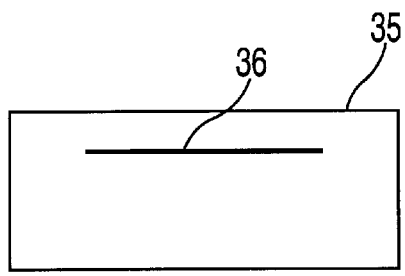
FIG. 3 is a side view of a ceramic body in a green state showing the embedded electrode as a solid line.
Figure 4:
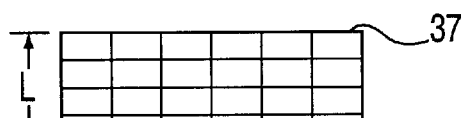
FIG. 4 is a diagrammatical illustration of etchable wire mesh laid out flat and having a length L.
Figure 5:
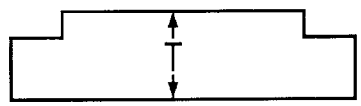
FIG. 5 is an illustration of the ultimate configuration of the electrostatic chuck manufactured by the process of the present invention and having a final thickness T.
Figure 6:
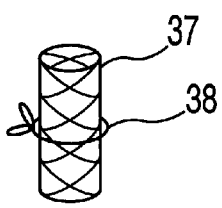
FIG. 6 is an illustration of a bundle of loosely rolled etchable metal wire mesh secured by a string or thread.
Figure 7:
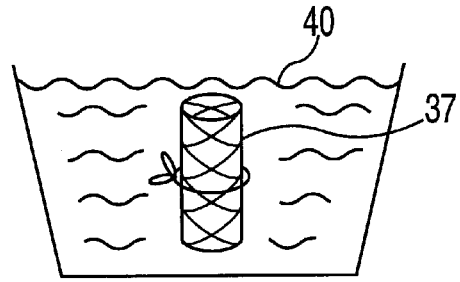
FIG. 7 is an illustration of soaking the bundle of loosely rolled etchable wire mesh shown in FIG. 6 in a slurry of ceramic material.
Figure 8:
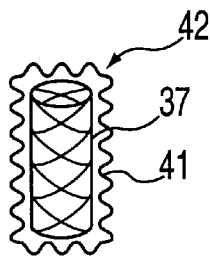
FIG. 8 is an illustration of a wire insert comprised of a matrix of the bundle of rolled etchable metal wire mesh and ceramic material.

Metal wire mesh 37, subject to etching, referred to hereinafter as etchable metal wire mesh, is shown in FIG. 4. Etchable metal wire mesh 37 is prepared having a length L which is equal to, or at least substantially equal to, the thickness T of the ultimate electrostatic chuck provided by the process of the present invention. Such a chuck is illustrated in FIG. 5 and shown to have a thickness T. The etchable metal wire mesh 37 is rolled into a loose bundle, as shown in FIG. 6, and is secured in the bundle by a suitable string or thread 38. As shown in FIG. 7, the loosely rolled etchable metal wire mesh bundle 37 is immersed and soaked in a slurry 40 of ceramic material which is the same as the ceramic material of which the green ceramic body 35, shown in FIG. 3, is made. The etchable metal wire mesh 37 is soaked in the slurry 40 to cause the ceramic material in the slurry to attach or adhere to the etchable metal wire mesh so as to produce the wire insert 42 shown in FIG. 8 which is a generally cylindrical matrix of the etchable metal wire mesh 37 and the adhering ceramic material indicated diagrammatically in FIG. 8 by the irregular line 41.

Figure 9:
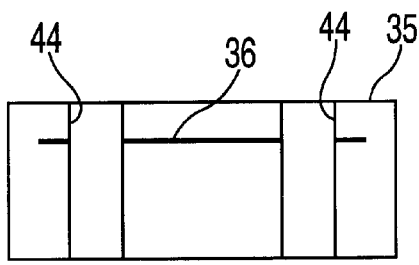
FIG. 9 is a diagrammatical illustration of a ceramic body in the green state having a plurality of holes extending therethrough.
Figure 10:
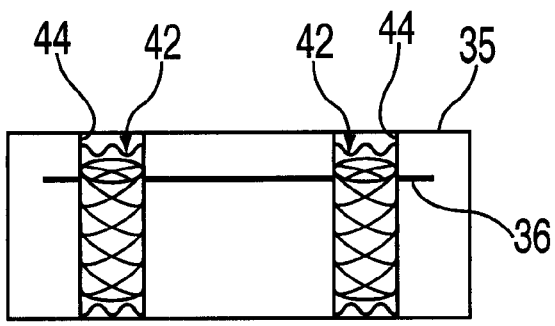
FIG. 10 is an illustration of the green ceramic body of FIG. 9 showing the wire insert of FIG. 8 inserted into the holes.

As depicted in FIG. 9 A plurality of holes 44 are formed extending through the green ceramic body 35 which holes may be formed suitably such as by punching. The holes 44 are formed complementary in diameter to the wire insert 42 but slightly longer in length. It will be understood that in the illustrative embodiment of the present invention the electrode 36 is comprised of molybdenum wire mesh. The molybdenum wire mesh comprises a plurality of molybdenum wires having spacing therebetween and that the plurality of holes 44 formed in the green ceramic body 35 are formed in the spaces between the molybdenum wires comprising the electrode 36. As shown in FIG. 10, a plurality of the wire inserts 42 are inserted into the plurality of holes 44. Although a plurality of inserts are generally used to provide sufficient gas distribution, as few as one insert can be used to provide gas to the surface of the chuck.

Figure 11:
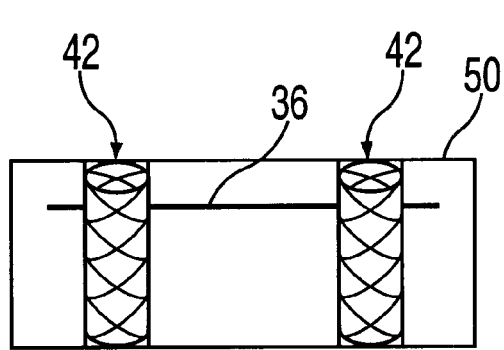
FIG. 11 is an illustration of a ceramic chuck body produced by hot pressing the green ceramic body having the wire inserts therein as shown in FIG. 9.

Once the inserts are in place, the green ceramic body having the wire inserts 42 inserted therein is suitably hot pressed or sintered, in a manner known to the art, at a temperature of about 1,700° C.–2,000° C., at a pressure of about 500 psi–2,000 psi, and in an atmosphere of nitrogen, to produce the ceramic body 50 shown in FIG. 11. There will be little or no distortion of the wire inserts 42 during such hot pressing because the ceramic material comprising the wire inserts 42, is the same ceramic material of which the green ceramic body 35 is made.

Figure 1:
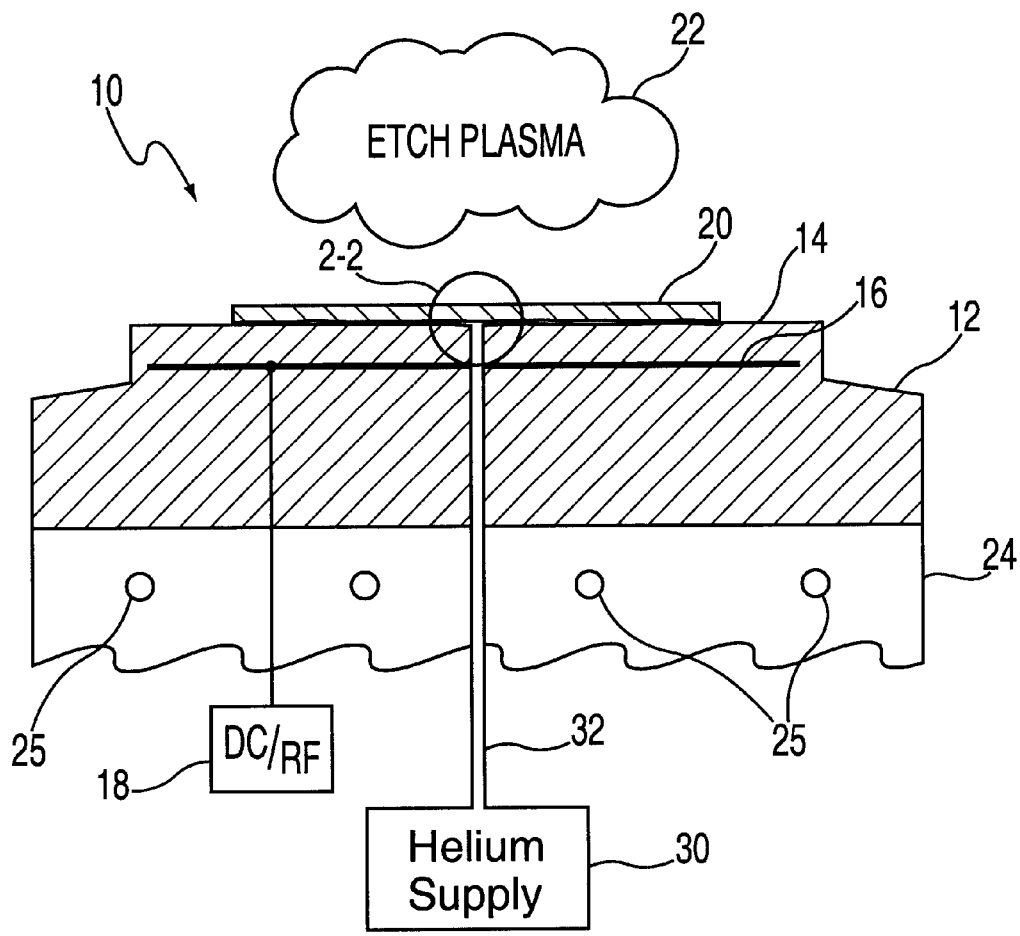
FIG. 1 is a diagrammatical illustration of prior art semiconductor wafer processing apparatus.
Figure 2:
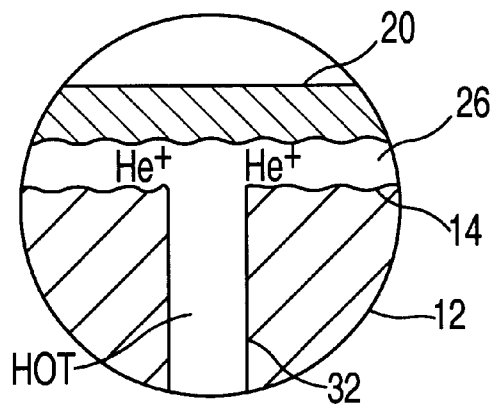
FIG. 2 is an enlarged view of the encircled portion 2—2 in FIG. 1.
Figure 12:
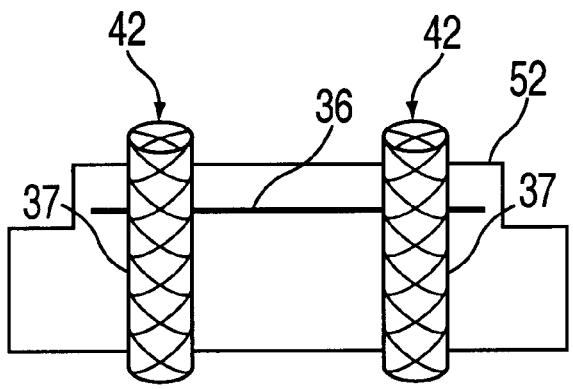
FIG. 12 is an illustration of the electrostatic chuck formed by machining the ceramic chuck body shown in FIG. 11.
Figure 13:
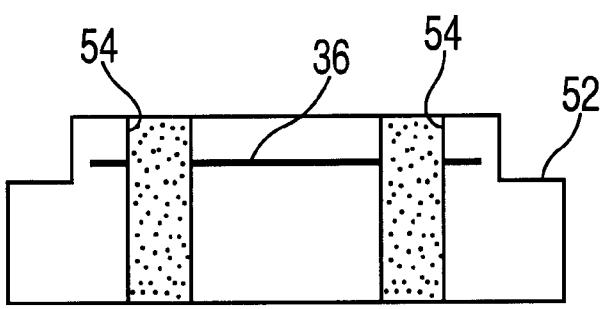
FIG. 13 is an illustration of the electrostatic chuck manufactured by the process of the present invention showing the gas inlet channels formed therein after the metal wires of the wire inserts shown in FIG. 12 have been removed.

Thereafter, as shown in FIG. 12, the ceramic body 50 from FIG. 11 is suitably machined, in a manner known to the art, to provide the final or ultimate shape of the electrostatic chuck 52 as shown in FIG. 12 with the opposed ends of the wire inserts 42 extending upwardly from the top and downwardly from the bottom of the chuck. This upward and downward extension of the wire inserts 42 makes the metal wire mesh 37 comprising the matrices 42 accessible for removal forming or leaving holes complementary in size and shape to the metal wires comprising the metal wire mesh. As shown in FIG. 13, the holes provide the plurality of gas inlet channels 54 through which thermal transfer gas can be supplied to the back side of the wafer 20 in FIG. 1.

In this embodiment of the process of the present invention, the etchable metal wire mesh 37 is molybdenum wire mesh and the ceramic material comprising the green ceramic body 35 of FIG. 3, the slurry 40 of FIG. 7, and the ultimate chuck 52 of FIG. 12, is aluminum nitride.

With further regard to the removal of the metal wire mesh 37 comprising the wire inserts 42 shown in FIG. 12, upon the metal wire mesh 37 being molybdenum wire mesh, ammonium ferricyanide may be used to chemically etch away the molybdenum wire mesh thereby forming or leaving holes. These holes provide the plurality of thermal transfer gas inlet channels 54 illustrated in FIG. 13. Upon the molybdenum wires comprising the molybdenum wire mesh 37 being chemically etched away, a labyrinth of gas inlet channels will be provided corresponding to the size and shape of the molybdenum wires comprising the molybdenum wire mesh, and such gas inlet channels 54 (FIG. 13) will have the same, or at least substantially the same, diameter as the molybdenum wires comprising the molybdenum wire mesh. The diameter of such molybdenum wires is about 100 micrometers and hence the plurality of gas inlet channels 54 (FIG. 13) formed by the etching away the molybdenum wires will also have a diameter of about 100 micrometers.

Alternatively, the molybdenum wires comprising the molybdenum wire mesh 37 may be removed by the step of thermal etching, such as by being heated to a temperature of about 500° C. in an oxidizing atmosphere (e.g., air) to oxidize the molybdenum wires into substantially powder followed by the step of blowing the powder from the channels such as with pressurized air.

Figure 14:
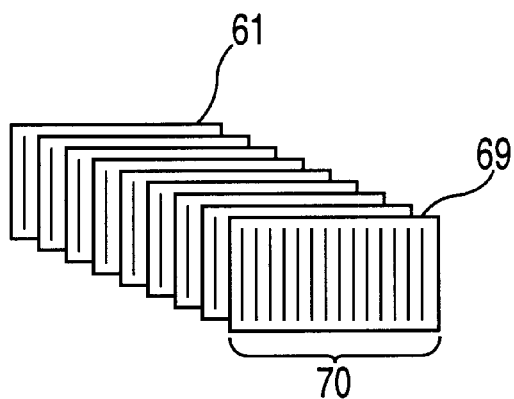
FIG. 14 is a diagrammatical view, in perspective, of a plurality of layers of fabric soaked in a slurry of ceramic material having a parallel array of etchable wires placed on each layer of fabric.
Figure 15:
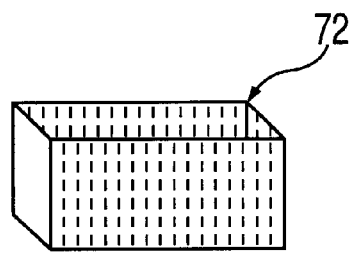
FIG. 15 is a diagrammatical view, in perspective, of a wire laminate in the green state provided by stacking and laminating the layers of fabric and parallel arrays of etchable wires shown in FIG. 14.
Figure 16:
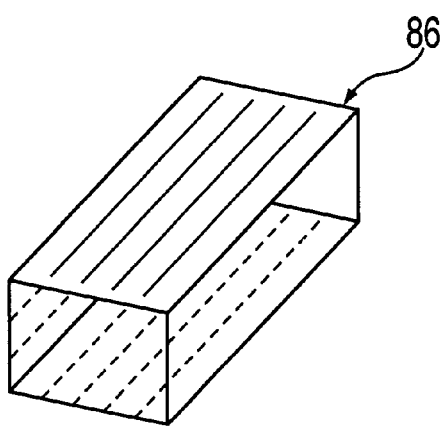
FIG. 16 is an illustration in of a wire insert produced by subdividing the green wire laminate shown in FIG. 14.

Referring to FIGS. 14–16, an alternate process embodiment for providing a plurality of wire inserts in accordance with the present invention is illustrated. A plurality of layers of fabric, 61 . . . 69, are shown in FIG. 14, which layers of fabric have been soaked in a slurry of ceramic material such as the slurry 40 shown in FIG. 7. This slurry is a slurry of the same ceramic material of which the green chuck body 35 shown in FIG. 5 is made. The ceramic material is, for example, aluminum nitride. The layers of fabric 61 . . . 69 may be, for example, cheese cloth. A parallel array of wires subject to etching, which wires are referred to hereinafter as etchable wires, such as the parallel array of etchable wires, indicated by the bracket 70 in FIG. 14, is placed on each of the slurry soaked fabrics 61 . . . 69. The slurry is dried to cause the dried slurry to hold or maintain the arrays of etchable wires 70 in place on the layers of fabric. Such etchable wires will have a length equal to, or at least substantially equal to, the thickness T (FIG. 5) of the final or ultimate electrostatic chuck formed by the process of the present invention. Thereafter, the layers of fabric having the parallel arrays of etchable wires thereon are stacked, with the wires oriented in the same direction, and laminated to produce the green wire laminate 72 shown in FIG. 15. Thereafter, the green wire laminate 72 is subdivided into subparts to provide a plurality of generally rectangular wire inserts such as the wire inserts 74 shown in FIG. 16. Accordingly, the wire inserts 74 comprise a matrix of etchable wires and ceramic material. Thereafter, a plurality of such wire inserts 74 are inserted into the holes 44 formed in a green chuck body, such as the green chuck body 42 shown in FIG. 9; however, in this embodiment the holes 44 formed in the green chuck body will be rectangular so as to be complementary in size and shape to the rectangular wire insert 74. Thereafter, the same processing steps described above with regard to the wire insert 42 shown in FIG. 8 and the processing steps illustrated in FIGS. 9–13, are practiced utilizing the wire inserts 74. More particularly, in the final step, the etchable metal wires comprising the wire insert 40 upon being etched away, either by chemical etching or thermal etching and blowing as described above with regard to the etchable metal wires comprising the wire mesh 37 of FIG. 4, a plurality of gas inlet channels will be formed complementary in size and shape to the etchable metal wires comprising the insert 74. In this embodiment, the etchable wires comprising the wire insert 74 are molybdenum wires having a diameter of about 100 micrometers and hence the thermal transfer gas inlet channels provided in the electrostatic chuck by the etching away of such molybdenum wires will have a diameter of about 100 micrometers. In this embodiment the etchable molybdenum wires are straight and hence the gas inlet channels provided upon removal of these wires will be substantially vertical and due to the hot pressing step described with regard to FIG. 11 above, the vertical gas inlet channels may be somewhat bent.

Figure 17:
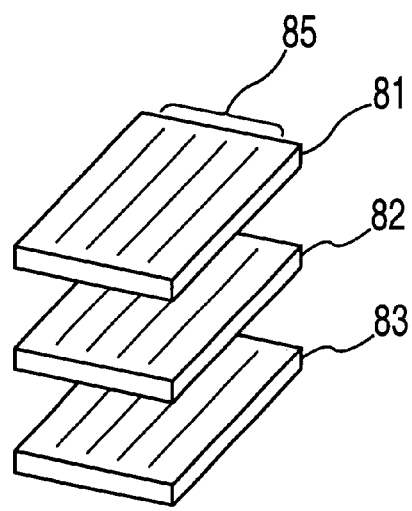
FIG. 17 is an illustration of a plurality of green tapes on which parallel arrays of etchable lines have been screen printed from paste or ink of etchable metal powder.
Figure 18:
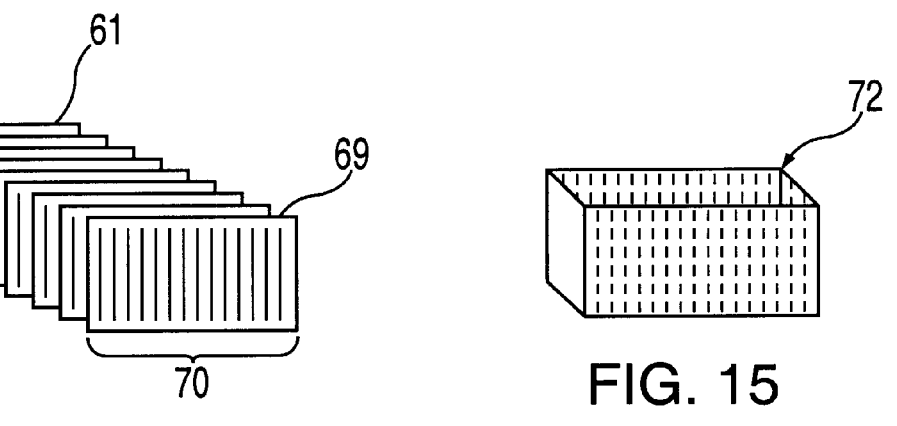
FIG. 18 is a diagrammatical view, in perspective, of a green wire laminate produced by laminating the layers of green tape and parallel arrays of etchable lines shown in FIG. 17.
Figure 19:
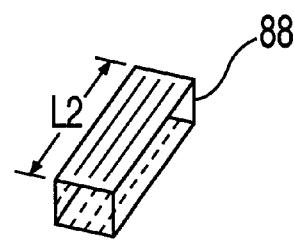
FIG. 19 is a diagrammatical view in perspective of an etchable line insert produced by subdividing the green wire laminate shown in FIG. 18.

Another alternate embodiment of the invention provides a plurality of inserts is illustrated in FIGS. 17–19. In this embodiment, a plurality of layers of green tapes 81, 82 and 83 shown in FIG. 17 are made from a casting of ceramic powder and one or more polymeric binders with the ceramic powder being powder of the same ceramic material of which the green ceramic body 35 as shown in FIG. 3 is made. A paste or ink of etchable metal powder, i.e., metal powder subject to etching, such as molybdenum powder is prepared. A parallel array of etchable lines from such paste or ink is screen printed onto each of the green tapes 81, 82 and 83 with such parallel array of etchable lines being indicated by the bracket 85 in FIG. 17. It has been found that in formulating the ink or paste made from molybdenum powder that the addition of very small amounts of palladium powder, e.g. 0.1–1.0%, or of nickel powder, e.g. 5%–10%, aids in the hot pressing of the molybdenum ink or paste into solid etchable lines similar to wire. Such molybdenum etchable lines, in the preferred embodiment have a width of about 100 micrometers, a thickness of about 100 micrometers, and a spacing therebetween of about 100 micrometers. Thereafter, layers of green tape 81–83 with the etchable lines 85 screen printed thereon were stacked with the etchable lines oriented in the same direction and laminated, to produce the green wire laminate 86 shown in FIG. 18. Thereafter, the green wire laminate 86 is suitably subdivided to provide a plurality of rectangular inserts such as the line insert 88 shown in FIG. 19 which is a matrix of etchable lines and ceramic material. Thereafter, a plurality of such line inserts 88 are inserted into the holes 44 formed in the green chuck body 35 shown in FIG. 9 and, in this embodiment, the holes 44 will be complementary in size and shape to the 85 lines within the rectangular line inserts 88. Thereafter, the same processing step described above with regard to the wire insert 42 shown in FIG. 8 and the processing steps illustrated in FIGS. 9 and 13 are practiced utilizing the inserts 88. More particularly, in the final step, the etchable metal lines that were screen printed on the green tapes 61–69 shown in FIG. 14 are etched away, either by chemical etching or by thermal etching and blowing as described above with regard to the etchable metal wires comprising the wire mesh 37 of FIG. 4. A plurality of gas inlet channels will be formed complementary in size and shape to such etchable metal lines and will have a crosssection substantially equal to 100 micrometers. In the abovedescribed hot pressing of the green ceramic body 35 (FIG. 10) into the ceramic body 50 (FIG. 11), the green ceramic body shrinks about 50% along its thickness and the same occurs with the line inserts 88. Hence, the length L2 (FIG. 19) is chosen to be about equal to twice the thickness T of the final or ultimate electrostatic chuck made by the process of the present invention. Further, the hot pressing of the line inserts 88 with the green ceramic body 35 (FIG. 10) hot presses or sinters the etchable lines 85 into substantially wires.

The thermal transfer gas inlet channels provided by the process embodiments described above will provide gas inlet channels having a diameter, or cross-section, of about 100 micrometers, and hence the volume of thermal transfer gas, such as helium or argon, supplied through these gas inlet channels will be of such small volume that the transfer gas will not have a tendency to become ionized and the abovedescribed prior art arcing problem will be overcome.

Although various embodiments which incorporate the teachings of the present invention have been shown and described in detailed herein, those skilled in the art can readily devise many other varied embodiments that still incorporate these teachings.

What is claimed is:

1. A method of manufacturing an electrostatic chuck, comprising the steps of:

providing a green ceramic body of ceramic material;

providing an insert comprising a matrix of elongate members and said ceramic material;

forming a hole through said green ceramic body complementary in size and shape to said insert;

inserting said insert into said hole;

hardening said green ceramic body with said insert therein to form a ceramic chuck body; and removing said elongate members to form a plurality of elongate holes complementary in size and shape to said elongate members and which holes provide the plurality of gas inlet channels.

2. The method of claim 1 further comprising the step of machining said ceramic chuck body.

3. The method of claim 1 wherein said step of providing an insert further comprises the step of providing a plurality of inserts each comprising a matrix of elongate members and said ceramic material.

4. The method of claim 3 wherein said removing step comprises etching said plurality of elongate numbers.

5. The method of claim 4 wherein said etching step comprises chemically etching said plurality of elongate members.

6. The method of claim 1 wherein said matrix comprises molybdenum wires.

7. The method of claim 6 wherein said chemically etching step comprises the step of chemically etching said molybdenum wires using ammonium ferricyanide.

8. The method of claim 1 wherein said elongate members are etchable wires and wherein said removing step comprises the steps of thermally etching said etchable wires to substantially powder and blowing said powder from said ceramic chuck body.

9. The method of claim 8 wherein said thermal etching step comprises the step of heating said molybdenum wires to about 500 c to oxidize the molybdenum wires into said substantially powder.

10. The method of claim 1 wherein said step of providing an insert comprises the steps of providing a bundle of loosely rolled etchable metal wire mesh and soaking said bundle in a slurry of said ceramic material to provide a plurality of matrices of said etchable metal wire mesh and said ceramic material, and wherein said removing step comprises the step of removing said etchable wire mesh.

11. The method of claim 10 wherein said removing step comprises etching said etchable wire mesh.

12. The method of claim 11 wherein said etching step further comprises chemically etching said etchable metal wire mesh.

13. The method of claim 12 wherein said bundle of loosely rolled etchable metal wire mesh is a bundle of loosely rolled molybdenum wire mesh and wherein said chemical etching step comprises the step of chemically etching said molybdenum wire mesh.

14. The method of claim 13 wherein said step of chemically etching comprises chemically etching said molybdenum wire mesh using ammonium ferricyanide.

15. The method of claim 10 wherein said removing step comprises the steps of thermally etching said etchable metal wire mesh to oxidize said etchable metal wire mesh into substantially powder and blowing said powder from said ceramic chuck body.

16. The method of claim 1 wherein said step of providing an insert comprising the steps of providing a plurality of layers of fabric soaked in a slurry of said ceramic material, placing a parallel array of etchable wires on each of said layers of soaked fabric, drying said slurry to hold said arrays of etchable wires in place on said layers of fabric, and stacking said layers of fabric having said parallel arrays of etchable wires with said parallel arrays of etchable wires being oriented in the same direction to form a green wire laminate, subdividing said green wire laminate into subparts to provide said plurality of said wire inserts, and wherein said removing step comprises the step of removing said etchable wires.

17. The method of claim 16 wherein said removing step comprises chemically etching said etchable wires.

18. The method of claim 17 wherein said etchable wires are molybdenum wires wherein said chemical etching step comprises the step of chemically etching said molybdenum wires using ammonium ferricyanide.

19. The method of claim 16 wherein said removing step comprises the steps of thermally etching said etchable wires into substantially powder and blowing said powder from said ceramic chuck body.

20. The method of claim 1 wherein said step of providing an insert comprises the steps of preparing a paste or ink of etchable metal powder, preparing a plurality of green tapes made from a casting of a slurry of ceramic powder of said ceramic material and at least one polymeric binder, screen printing said paste or ink of etchable metal powder on said layers of green tape in the form of parallel arrays of etchable lines having a width, a thickness and a spacing therebetween, drying said lines, stacking said layers of green tape with said etchable lines screen printed thereon with the etchable lines oriented in the same direction and laminating said layers of green tape with said etchable lines screen printed thereon to provide a green wire laminate, and subdividing said green wire laminate into a plurality of subparts to provide said plurality of line inserts, and wherein said removing step comprises the step of removing said etchable lines to provide said plurality of gas inlet channels having a size and shape complementary in size and shape to said etchable lines.

21. The method of claim 20 wherein said removing step comprises the step of etching said etchable lines.

22. The method of claim 21 wherein said etching step comprising the step of chemically etching said etchable lines.

23. The method of claim 22 wherein said step of providing an insert comprises the steps of preparing a paste or ink of molybdenum powder, preparing a plurality of green tapes from a casting of a slurry of ceramic powder of said ceramic material and at least one polymeric binder, screen printing said paste or ink of molybdenum powder on said layers of green tape in the form of parallel arrays of molybdenum lines having a width, thickness, and a spacing therebetween, drawing said lines, stacking said lines of green tape with said etchable molybdenum lines screen printed thereon with the molybdenum lines oriented in the same direction and laminating said layers of green tape with said molybdenum lines screen printed thereon to provide a green wire laminate, and subdividing said green wire laminate into a plurality of subparts to provide said plurality of line inserts, and wherein said removing step is a chemical etching step of chemically etching said molybdenum lines away using ammonium ferricyanide.

24. The method of claim 21 wherein said removing step is the step comprise the step of thermally etching said etchable lines into substantially powder and wherein said process includes the further step of blowing said powder from said ceramic chuck body.

25. The method of claim 1 wherein between said step of inserting said insert into said hole and said step of hardening said green ceramic body with said insert therein to form a ceramic chuck body, the method further comprises the step of compacting said green ceramic body having said insert inserted therein to form a monolithic green structure incorporating said insert, and wherein said step of hardening said green ceramic body to form the ceramic chuck body comprises the step of hardening monolithic green structure incorporating said insert.

26. The method of claim 1 wherein said insert comprises a matrix of etchable wires having a diameter of about 100 micrometers and said ceramic to cause said plurality of gas inlet channels to have a diameter of about 100 micrometers.

27. An electrostatic chuck for supporting a semiconductor wafer during wafer processing comprising at least one insert having a matrix of channels.

28. The electrostatic chuck according to claim 27 wherein said at least one insert comprises a ceramic material that is the same as the ceramic material used to manufacture a chuck body.

29. An electrostatic chuck comprising:
   a ceramic chuck body having a matrix of channels formed by providing a green ceramic body of ceramic material; providing an insert comprising a matrix of elongate members in said ceramic body; forming a hole through said green ceramic body complementary in size and shape to said insert; inserting said insert into said holes; hardening said green ceramic body with said insert therein to form a ceramic chuck body; and removing said elongate members to form a plurality of elongate holes complementary in size and shape to said elongate members and which holes provide the plurality of gas inlet channels.

30. The electrostatic chuck of claim 29 wherein providing an insert further comprises providing a plurality of inserts each comprising a matrix of elongate members and said ceramic material.

31. The electrostatic chuck of claim 30 wherein said plurality of elongate numbers are removed by etching.

32. The method of claim 29 wherein said elongate members are etchable wires and wherein said etchable wires are removed by thermally etching said etchable wires to substantially powder and blowing said powder from said ceramic chuck body.

* * * * *

UNITED STATES PATENT AND TRADEMARK OFFICE
CERTIFICATE OF CORRECTION

PATENT NO.   : 6,370,006 B1
DATED        : April 9, 2002
INVENTOR(S)  : Kumar et al.

It is certified that error appears in the above-identified patent and that said Letters Patent is hereby corrected as shown below:

Column 3,
Line 19, please delete "in".
Line 66, please replace "FIG. 9 A" with -- FIG. 9, a --.

Column 4,
Line 15, please insert "35" after " body".

Column 6,
Line 46, please replace "embodiment s" with -- embodiments --.

Column 7,
Line 18, please replace "claim 1" with -- claim 5 --.

Column 10,
Line 14, please replace "The method" with -- The electrostatic chuck --.

Signed and Sealed this

Eighth Day of October, 2002

Attest:

Attesting Officer

JAMES E. ROGAN
Director of the United States Patent and Trademark Office